(12) United States Patent
Loyau et al.

(10) Patent No.: US 12,038,460 B2
(45) Date of Patent: Jul. 16, 2024

(54) CURRENT DETECTOR CONFIGURED TO MEASURE A CURRENT CIRCULATING IN AN ELECTRICAL CONDUCTOR, ASSOCIATED MAGNETIC FIELD SENSOR, SYSTEM AND METHOD

(71) Applicants: CENTRE NATIONAL DE LA RECHERCHE SCIENTIFIQUE, Paris (FR); ECOLE NORMALE SUPERIEURE PARIS-SACLAY, Gif-sur-Yvette (FR)

(72) Inventors: Vincent Loyau, Paris (FR); Gérard Chaplier, les Ulis (FR); Frédéric Mazaleyrat, Orsay (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 199 days.

(21) Appl. No.: 17/774,182

(22) PCT Filed: Nov. 4, 2020

(86) PCT No.: PCT/EP2020/080984
§ 371 (c)(1),
(2) Date: May 4, 2022

(87) PCT Pub. No.: WO2021/089634
PCT Pub. Date: May 14, 2021

(65) Prior Publication Data
US 2022/0349920 A1      Nov. 3, 2022

(30) Foreign Application Priority Data

Nov. 5, 2019 (FR) ........................ 1912406

(51) Int. Cl.
*G01R 15/20* (2006.01)

(52) U.S. Cl.
CPC .................................. *G01R 15/20* (2013.01)

(58) Field of Classification Search
CPC ..................................................... G01R 15/20
See application file for complete search history.

(56) References Cited

U.S. PATENT DOCUMENTS 8,330,453 B2 * 12/2012 Hotz .................... G01R 15/207
324/207.2

FOREIGN PATENT DOCUMENTS

| CN | 106908634 A | 6/2017 | |
|---|---|---|---|
| CN | 109425774 A | 3/2019 | |
| CN | 109425775 A | 3/2019 | |
| DE | 102012206096 A1 * | 10/2012 | ........... G01R 15/205 |

* cited by examiner

Primary Examiner — Jay Patidar
(74) Attorney, Agent, or Firm — WC&F IP

(57) ABSTRACT

The invention concerns a current detector (10) suited to measure a current circulating in an electrical conductor (12), the current detector (10) including:
  a probe (14) including:
  a converter (18) suited to convert the magnetic field induced by the current to be measured in the conductor (12) into a voltage, wherein the converter (18) is a magnetostrictive, piezoelectric composite material, and
  a circuit (16) for detecting the voltage converted by the converter (18).

10 Claims, 6 Drawing Sheets

Figure 1:
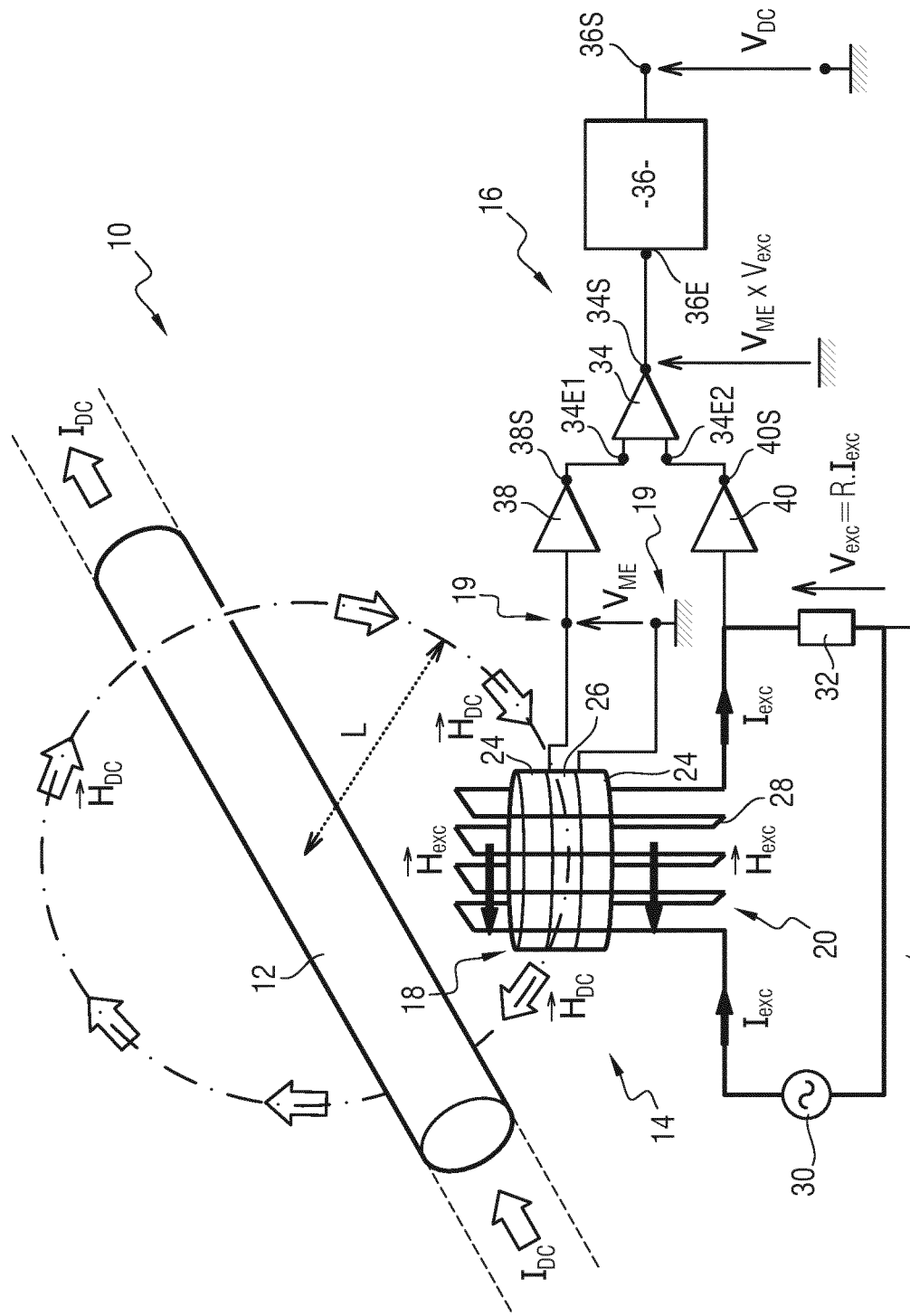

CURRENT DETECTOR CONFIGURED TO MEASURE A CURRENT CIRCULATING IN AN ELECTRICAL CONDUCTOR, ASSOCIATED MAGNETIC FIELD SENSOR, SYSTEM AND METHOD

This invention concerns a current detector suited to measure a current circulating in an electrical conductor. This invention also concerns an associated detection system and method.

For numerous applications involving electrical motors, precise knowledge of the present current circulating in a conductor is desirable. This is also the case for other applications, e.g. the management of energy stored in batteries or electricity meters for the area or circuits connected to such devices.

To this end, the use of Hall sensors, which detect the magnetic field produced by the electrical current to be measured that is circulating in a cable, is known. The Hall effect is the general property of electrical conductors and semiconductors that produce an electrical voltage when they are inserted into a magnetic field whilst carrying a bias current.

However, with such probes, voltage drift may occur in some cases where multiple Hall probes connected to a complex electronic circuit are used simultaneously.

In another technique, a resistor is inserted into the circuit. The resistor acts as a shunt, allowing for the measurement of the electrical current by reading the voltage at its terminals due to Ohm's law.

However, the disadvantages of such a technique are the insertion of a dissipative component into the circuit and the lack of galvanic isolation between the circuit being measured and the measuring circuit.

Another known-art technique consists of using a current transformer having a primary connected in series in the circuit and a secondary providing an electrical voltage proportional to the variable current present in the primary.

However, when using such a transformer, it is not possible to measure direct currents. The principle also requires the circuit to be cut in order to insert a reactive element, which may adversely affect its operation. To measure low frequencies or very strong currents, a magnetic circuit of considerable size is provided, making such a current sensor heavy and expensive.

Yet another technique is illustrated by documents CN 106 908 364 A, CN 109 425 775 A, and CN 109 425 774 A, which each propose the determination of a current using a magnetostrictive element in a passive sensor.

However, such passive sensors are also unable to measure direct currents, only alternating currents.

Thus, there is a need for a simpler current detector that allows for the measurement of an electrical current with satisfactory precision that remains stable over time.

To this end, a current detector is described that is suited to measure a current circulating in an electrical conductor, the current detector including a probe that includes a converter that is suited to convert the magnetic field induced by the current being measured in the conductor into a voltage, wherein the converter is a magnetostrictive, piezoelectric composite material, and a circuit for detecting the voltage converted by the converter.

Thus, the current detector is an active sensor capable of measuring all types of currents (alternating, direct, alternating and direct) by the clever use of a linear part of the development of the voltage generated by the converter as a function of the field.

Moreover, this current detector functions without permanent magnets.

In particular embodiments, the current detector comprises one or more of the following characteristics, alone or in any combination technically possible:

the probe further includes an excitation winding arranged so as to generate a modulating magnetic field in the converter and the detection circuit including a unit for demodulating the voltage converted by the converter the detection circuit further includes a low-pass filter (LPF) positioned after the demodulation unit the detector includes a magnetic flux concentrator having an air gap, the probe being positioned in the air gap of the concentrator the concentrator has two parts the detector includes a support having two ends, a first end for holding the probe and a second end affixed to the conductor the detector includes the conductor in which the current being measured circulates, wherein the conductor delimits a loop for which a centre is defined, the probe being positioned in the centre of the loop.

The description also concerns a system, in particular a motor, comprising a detector as described supra.

The description also concerns a magnetic field sensor suited to measure a magnetic field, wherein the field sensor includes a probe that includes a converter that is suited to convert the magnetic field in the conductor into a voltage, wherein the converter is a magnetostrictive, piezoelectric composite material, and a circuit for detecting the voltage converted by the converter.

The description also concerns a method for measuring a current circulating in an electrical conductor by a current director including a converter and a detection circuit, wherein the converter is a magnetostrictive, piezoelectric composite material, wherein the method includes converting, by the converter, the magnetic field induced by the current to be measured in the conductor into a voltage, and detecting, by the detection circuit, the voltage converted by the converter.

Figure 2:
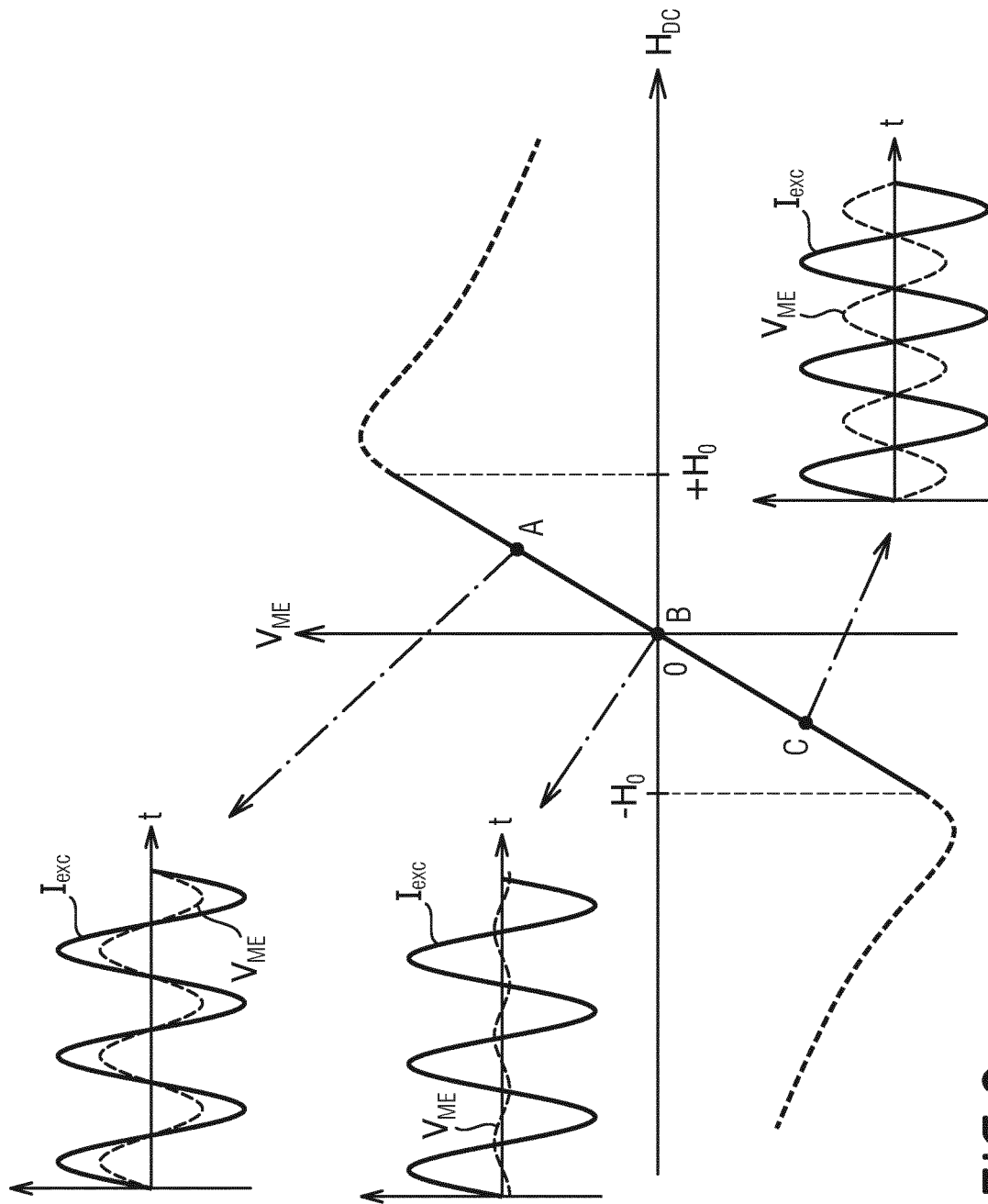
Figure 3:
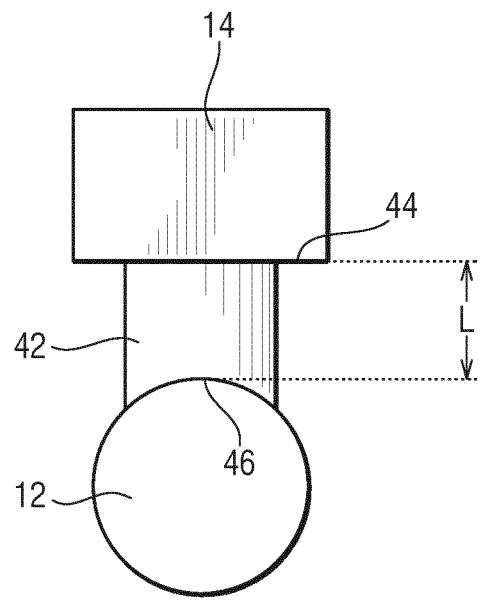
Figure 4:
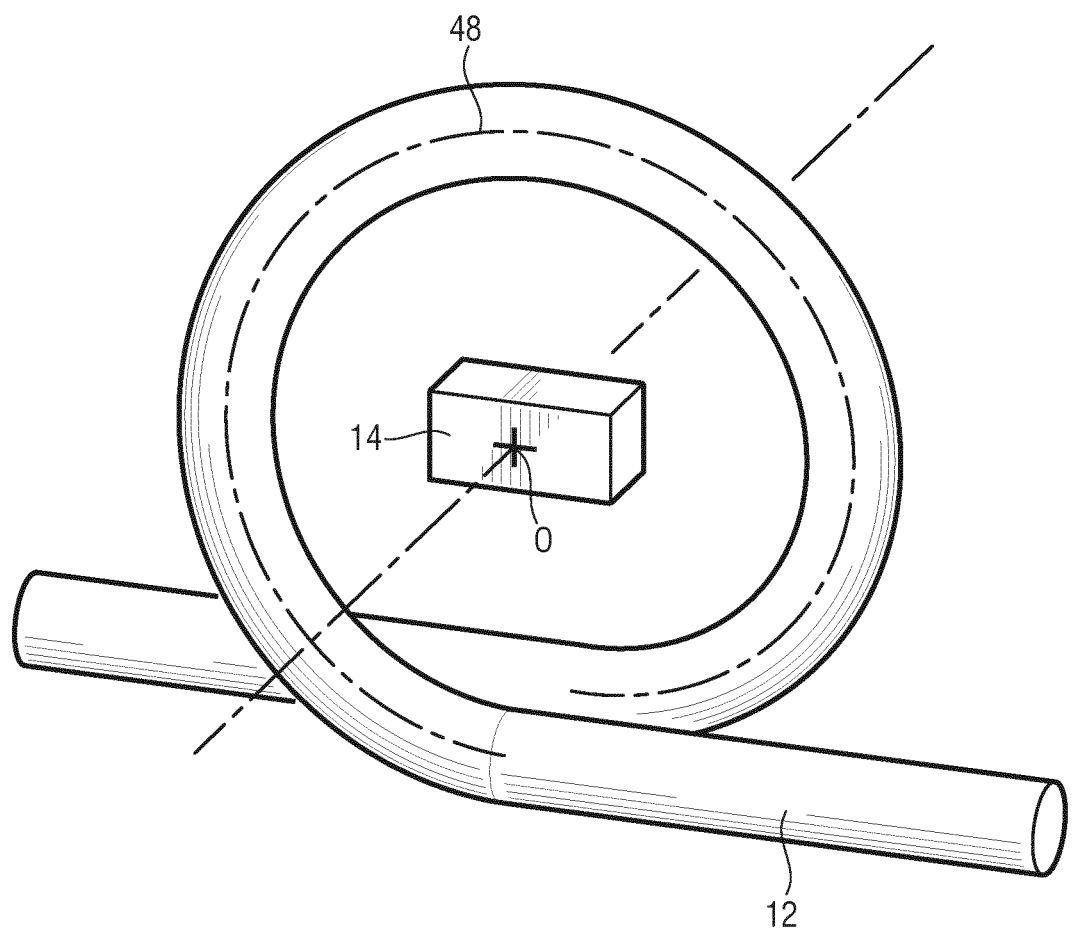
Figure 5:
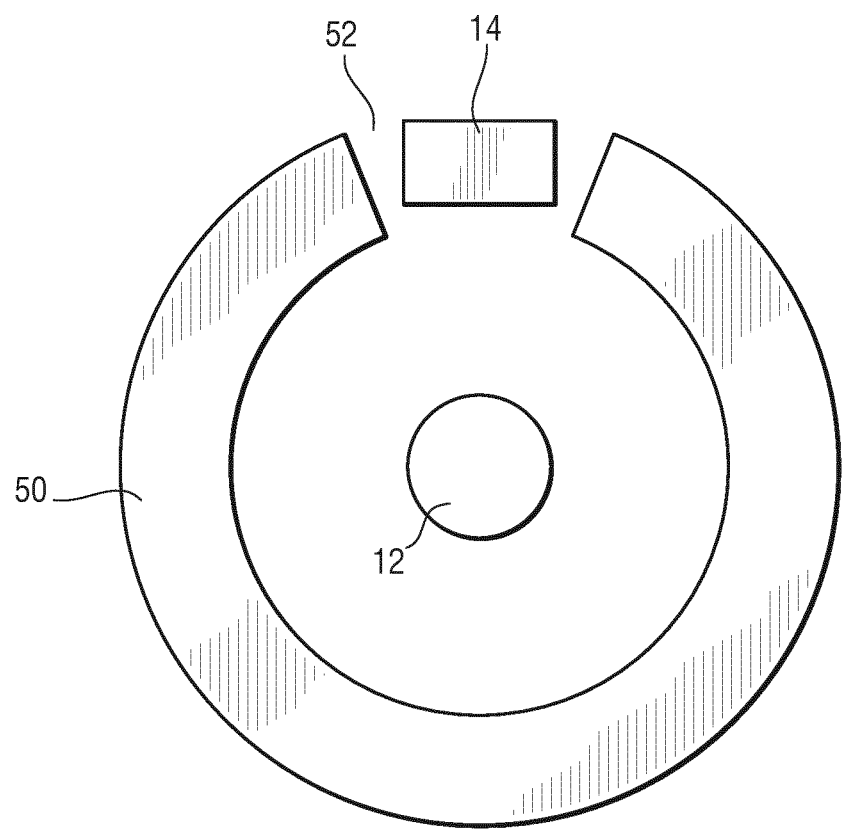
Figure 6:
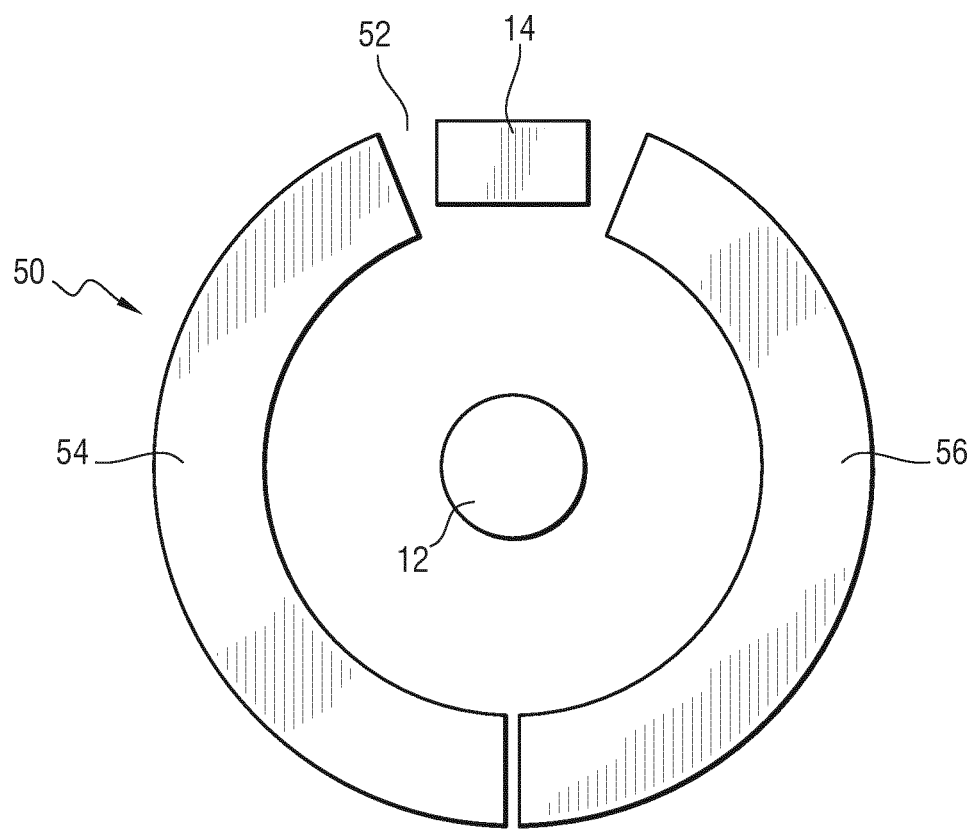

Other characteristics and advantages of the invention will become apparent from a reading of the following description of embodiments of the invention, which is provided solely by way of example, and by reference to the drawings:

FIG. 1: a schematic representation of an example of a current detector comprising a converter of magnetic fields into voltages;

FIG. 2: a graph of the development of the voltage generated by the converter of FIG. 1 as a function of the field and three insets showing the development over time of the voltage generated for three specific operating points (A, B, and C, respectively);

FIG. 3: a partial schematic representation of another example of a current detector in side view;

FIG. 4: a partial schematic representation of yet another example of a current detector in side view;

FIG. 5: a partial schematic representation of another example of a current detector in side view; and FIG. 6: a schematic representation of a variant of the current detector of FIG. 5.

A current detector 10 is shown in FIG. 1.

The detector 10 is suited to measure a current circulating in an electrical conductor 12.

The detector 10 is a contact-free detector.

'Measuring' refers to measuring the instantaneous amplitude of the current being measured.

The detector 10 of FIG. 1 is suited to measure the amplitude of the current being measured and the sign of the current being measured at the same time.

The detector 10 is thus suited to measure direct and alternating currents simultaneously.

However, more generally, the detector 10 is suited to measure only one of the two types of current, i.e. either a direct current or an alternating current.

Moreover, as shown in FIG. 1, the conductor 12 is an electrical cable.

When an electrical current passes through the conductor 12, the conductor 12 is suited to generate an induced magnetic field $H_{DC}$.

The induced magnetic field $H_{DC}$ produces field lines forming concentric circles. To illustrate the circle formed by the field lines in FIG. 1 at a distance L around the conductor 12, several vectors are represented by a white arrow.

The current detector 10 includes a probe 14 and a detection circuit 16.

The probe 14 includes a converter 18, an excitation winding 20, and a supply circuit 22.

The converter 18 is placed at the distance L from the conductor 12. The distance between the converter 18 and the conductor 12 is measured between their respective centres of gravity.

The converter 18 is suited to convert the magnetic field induced by the current being measured in the conductor 12 into a voltage between the terminals 19 of the converter 18.

In the example shown, the converter 18 is a magnetostrictive, piezoelectric composite material.

Such a composite is sometimes also referred to as a magnetoelectric composite.

As shown in FIG. 1, the converter 18 includes two first layers 24 of magnetostrictive material and a second layer 26 of a piezoelectric material.

The first layer 24 and the second layer 26 are mechanically coupled.

The magnetostrictive material is a nickel-zinc-cobalt ferrite having the composition $Ni_{1-x-y}Zn_xCo_yFe_2O_4$, in which the values x and y are such that 0<x<0.5 and 0<y<0.1.

In one variant, the magnetostrictive material is an alloy of iron, terbium, and dysprosium.

In another variant, the magnetostrictive material is made of cobalt, nickel, or iron, or an alloy of at least two of the aforementioned metals.

In yet another variant, the magnetostrictive material is an iron-gallium alloy.

In yet another variant, the magnetostrictive material is an iron-aluminium alloy.

In yet another variant, the magnetostrictive material is a magnetic amorphous metal alloy.

For example, the piezoelectric material 26 is made of PZT (lead zirconate titanate) or PVDF (PolyVinyliDene Fluoride).

However, any piezoelectric material may be used to form the second layer 26.

The two first layers 24 and the second layer 26 are superimposed in a stacking direction.

The layers 24 and 26 are cofritted, or the layers 24 are deposited on the layer 26 by a metal electroplating method.

The second layer 26 is interposed between the two first layers 24.

The aspect ratios of the layers 24 and 26 are between 1 and 10000.

By definition, the aspect ratio of a layer is the ratio between the diameter of the layer and its thickness. As can be seen in the schematic, the layers are cylindrical with a circular base; the diameter is the diameter of the base, and the thickness is the height of the cylinder.

In one variant, the layers 24 and 26 have a square or rectangular cross-section, or a cross-section of any shape.

In one variant, the layers 24 and 26 have different cross-sections and dimensions.

In one variant, the converter 18 includes more first or second layers 24 and 26.

In practice, the optional number of layers depends on the choice of materials used to form the first layer 24 and the second layer 26.

In one variant, the magnetoelectric material is obtained by cofritting a mixture of powders of piezoelectric materials and powders of magnetostrictive materials.

In the presence of a variable magnetic field, the magnetostrictive material of each first layer 24 is deformed.

The deformation of the magnetostrictive material is transmitted to the piezoelectric material because each first layer 24 is mechanically coupled with the second layer 26.

The deformation transmitted to the piezoelectric material generates a potential difference between the terminals of the converter 18.

Such a transformation of a variable magnetic field into voltage is referred to as a direct magnetoelectric effect.

The voltage obtained is referred to as the 'magnetoelectric voltage' and referred to hereinafter as $V_{ME}$.

The excitation winding 20 includes turns 28 forming a coil.

In FIG. 1, 4 turns 28 are shown.

More generally, the number of turns 28 is between 10 and 1000.

The excitation winding 20 is arranged so as to excite the converter 18.

More specifically, the excitation winding 20 is arranged so as to generate a modulating magnetic field $H_{exc}$ in the converter 18.

The modulating magnetic field is indicated in FIG. 1 by black arrows.

Here, the turns 28 are wound in the direction followed by the induced magnetic field $H_{DC}$.

The supply circuit 22 is suited to supply the excitation winding 20.

The supply circuit 22 includes an excitation source 30 and a resistor 32.

The excitation source 30, the resistor 32, and the excitation winding 20 are connected in series.

The excitation source 30 is suited to generate an excitation current $I_{exc}$.

The excitation current $I_{exc}$ generated by the excitation source 30 is an alternating current that is sinusoidal, triangular, square, or of any shape.

Additionally, the excitation current $I_{exc}$ has a frequency ('excitation frequency') greater than or equal to 100 Hz.

Advantageously, the excitation frequency is greater than or equal to 100 kHz.

The excitation source 30 is also suited to generate an alternating current with a constant amplitude.

The amplitude of the excitation current $I_{exc}$ is between 1 and 200 mA.

The resistor 32 allows the excitation current $I_{exc}$ to be converted into an excitation voltage $V_{exc}$.

The excitation source 30 and the excitation winding 20 thus form an excitation circuit suited to impose an excitation magnetic field in the converter 18.

The detection circuit 16 is an electronic circuit suited to detect the voltage $V_{ME}$ converted by the converter 18.

More specifically, the detection circuit 16 carries out synchronous detection of the converted voltage $V_{ME}$.

In the example proposed, the detection circuit 16 includes a first amplifier 38, a second amplifier 40, a demodulation unit 34, and a filter 36.

In the example proposed, the demodulation unit 34 is a multiplier suited to multiply two input signals, one of which is sent to a first input 34E1 and the other is sent to a second input 34E2.

The first amplifier 38 is suited to amplify the converted signal $V_{ME}$ according to a first gain, whilst the output 38S of the first amplifier 38 is connected to the first input 34E1 of the demodulation unit 34.

The second amplifier 40 is suited to amplify the excitation voltage $V_{exc}$ according to a second gain, whilst the output 40S of the second amplifier 40 is connected to the second input 34E2 of the demodulation unit 34.

The filter 36 is positioned after the demodulation unit 34. The input 36E of the filter 36 is connected to the output 34S of the demodulation unit 34.

Thus, the filter 36 is suited to filter the signal from the demodulation unit 34, i.e. a signal proportional to the product of the converted signal $V_{ME}$ and the excitation voltage $V_{exc}$.

In the example described, the filter 36 is an LPF capable of filtering the component at twice the frequency of the excitation voltage $V_{exc}$ of the converted signal $V_{ME}$ multiplied by the excitation voltage $V_{exc}$.

By way of example, the filter 36 is a first- or second-order filter.

In one variant, the filter 36 is provided digitally.

Thus, a filtered voltage $V_{DC}$ representative of the induced magnetic field $H_{DC}$ between the output 36S of the filter 36 and earth is obtained at the output of the filter 36.

The operation of the detector 10 will now be illustrated by reference to an exemplary embodiment of a method for measuring a current to be measured.

The measuring method includes a conversion step and a detection step.

During the conversion step, the converter 18 converts the induced magnetic field $H_{DC}$ and the excitation magnetic field $H_{exc}$ into a voltage $V_{ME}$.

The detection circuit 16 then detects the converted voltage, thus allowing the induced field $H_{DC}$ and the current being measured to be determined.

The detector 10 makes it possible to detect the current being measured with a simplified electronic circuit.

To fully understand such an advantage, a better understanding of the functioning of the converter 18 is worthwhile.

The converter 18 has a characteristic electrical voltage—magnetic field $H_{DC}$ shown in FIG. 2 for a sinusoidal excitation current $I_{exc}$ with a fixed amplitude.

The characteristic of the converter 18 has a linear portion for a magnetic field having a lower absolute value than a threshold value $H_0$.

The threshold value $H_0$ is obtained experimentally for any combination of materials forming the layers 24 and 26.

It should be noted that the linear portion includes the value corresponding to a zero field.

All possible specific cases are shown by three insets in FIG. 2.

When the current being measured is positive (inset corresponding to point A in FIG. 2), the field generated is strictly positive and strictly below the threshold value $H_0$. The converted signal $V_{ME}$ and the excitation current $I_{exc}$ are then in phase. The sinusoidal signal obtained by multiplying the two signals has a frequency that is double the excitation frequency and is always positive. The mean is linearly linked to the amplitude of the current being measured.

When the current being measured is negative (inset corresponding to point C in FIG. 2), the field generated is strictly negative and strictly greater than the opposite of the threshold value $-H_0$. The converted signal $V_{ME}$ and the excitation current $I_{exc}$ are then phase shifted, resulting in a negative mean that is also linearly linked to the amplitude of the current being measured.

In the vicinity of 0 (inset corresponding to point B in FIG. 2), the sinusoidal signal obtained is a sinusoid centred around 0.

Thus, a voltage $V_{DC}$ is obtained at the output of the detector 10 that is the image of the current being measured over a current range between $-I_O$ and $I_O$, where $I_O$ corresponds to the value of the current inducing a field having the value $H_O$.

Given the symmetry of the linear range around the nil value of the field of the converter 18, the detector 10 has a greater dynamic range than the other know-art detectors based on magnetoelectric materials.

Furthermore, the detector 10 can operate without using a permanent magnet or any other element capable of generating static polarisation.

The detector 10 also has the advantage that it can detect currents of all types, i.e. direct and alternating currents.

Given the use of synchronous demodulation, the detector 10 provides better noise rejection, in particular in an environment in which the power grid produces significant electromagnetic interference at 50 Hz.

Moreover, the detector 10 is suited to detect current regardless of the direction of propagation of the current in the conductor 12. As such, the detector 10 is a bidirectional detector.

The detector 10 involves a relatively simple detection circuit 16, thus facilitating the implementation of the measuring method. Indeed, the detection circuit 16 of FIG. 1 only includes a demodulation unit 34, a filter 36, and two amplifiers 38 and 40, a small number of components (4 in the case of FIG. 1).

Given such simplicity and the measurement precision obtained, the detector 10 is thus well suited for use in systems where current control is desirable. In particular, this is the case for electrical engines in automobiles, engines in rail traction systems, wind generators, and switched-mode power supplies. More generally, electric—electric, electronic, or electromechanical conversion systems are systems in which the detector 10 is particularly called for.

FIG. 3 shows another example of a detector 10.

Only the differences between the detectors 10 of FIGS. 1 and 3 are discussed in the following description.

In the case of FIG. 3, the detector 10 includes a support 42 having two ends, a first end 44 for holding the probe 14 and a second end 46 affixed to the conductor 12.

The support 42 is made of a material that is neither magnetic nor conductive.

In particular, the support 42 serves to position the converter 18 stably relative to the conductor 12. In particular, the support 42 allows the distance and orientation of the converter 18 to remain fixed relative to the conductor 12.

In the case of FIG. 1, the intensity of the field $H_{dc}$ emanating from the conductor 12 varies by 1/L. The distance between the first end 44 and the second end 46 is L, such that the positioning of the probe 14 remains quite constant over the course of the measurement, so that the intensity of the field $H_{DC}$ as seen by the detector 10 depends only on the current $I_{DC}$.

A variant of the detector 10 is shown in FIG. 4.

To the extent that the components as a whole are shared with the case of the detector of FIG. 1, only the differences are emphasized in the following and shown in FIG. 4 for the sake of clarity.

In such an example, the detector 10 includes the conductor 12 in which the current being measured circulates.

Moreover, the conductor 12 has a turn such that the conductor 12 delimits a loop 48 for which a centre O is defined.

The probe 14 is positioned in the centre of the loop 48 delimited by the conductor 12.

This makes it possible to increase the sensitivity of the detector 10.

To improve this effect, it is possible for the conductor 12 to have several successive loops.

In such a case, a support made of material that is neither magnetic nor conductive is advantageously used to rigidly fix the probe 14, such that the probe 14 cannot move inside the turn(s) for the duration of the measurement process.

Another example of a detector 10 is shown schematically in FIG. 5.

Only the differences between the detectors 10 of FIGS. 1 and 5 are discussed in the following description.

In the example of FIG. 5, the detector 10 further includes a magnetic flux concentrator 50.

The flux concentrator 50 is suited to concentrate and guide the magnetic field lines towards an air gap 52.

Another known-art term for a flux concentrator is 'flux channelizer'.

In the example of FIG. 5, the flux concentrator 50 has an annular shape in which an air gap 52 is provided.

In each case, the flux concentrator 50 is made of soft magnetic material, e.g. manganese-zinc ferrite, nickel-zinc ferrites, or an iron-silicon alloy.

The probe 14 is positioned in the air gap 52 of the magnetic flux concentrator 50.

This allows for an increase in the sensitivity of the detector 10 and makes it possible for the sensitivity of the detector 10 to be independent of the position of the conductor 12 in the flux concentrator 50.

In the example proposed, the flux concentrator 50 is made of a single part.

However, in one variant, the flux concentrator 50 is also made of more than two parts.

This makes it possible to provide a sort of easy-to-use current clamp.

For example, as shown in FIG. 6, the flux concentrator 50 is made of two identical parts 54 and 56, making it possible to mount the concentrator 50 without having to dismantle the conductor 12.

Other embodiments of the detector 10 are possible, in particular with regard to the detection circuit 16.

In one example, to reduce its sensitivity to external interference, at least one of the amplifiers 38 and 40 is mounted in differential.

The first amplifier 38 that receives the signal from the second layer 26 serves to amplify the signal of a transducer that is essentially capacitive.

In a first exemplary embodiment, the first amplifier 38 is an amplifier with very high input impedance, i.e. an amplifier with an input impedance between 100 kΩ and 100 GΩ.

Advantageously, the first amplifier 38 includes a bootstrap circuit to increase the input impedance.

In another exemplary embodiment, the first amplifier 38 is a charge amplifier 38 (in differential or otherwise).

In yet another example, to make the detector 10 even simpler, the number of components of the detection circuit 16 may be further reduced by eliminating the two amplifiers 38 and 40 and using multipliers for input impedance and gain that are compatible with the rest of the assembly as a demodulation unit 34.

To simplify the detector 10 even further, the number of components of the detection circuit 16 may be reduced even more in another embodiment by using only the two amplifiers 38 and 40, followed by two AD converters connected to a computer suited to carry out demodulation and filtering operations in the digital domain.

An example of such a computer is a microcontroller.

In one variant, the computer is a programmable logic circuit. Such a circuit is commonly referred to using the abbreviation FPGA ('field-programmable gate array').

In another example, the computer is an integrated circuit suited for an application.

Such a circuit is commonly referred to by the acronym ASIC ('application-specific integrated circuit').

More generally, the detection circuit 16 is made using electronic circuits that are either digital or electronic.

In any case, the detection circuit 16 plays at least one of the following roles: adapting impedance, amplifying a signal, multiplying a signal, or filtering a signal.

Alternatively or additionally, the detector 10 includes a resonance damping system.

The damping system serves to damp any mechanical resonance modes of the detector 10, typically at frequencies of several hundred kHz, which may be excited when transitory signals appear in the conductor 12.

In a first specific example, the damping system consists of one or more additional layers of dissipative material bonded to one or both of the layers 24 of magnetic material.

In one specific example, the dissipative material is a polymer charged with metal powder.

In a first specific example, the damping system is an electrical circuit formed by an assembly of components selected from a resistor, an inductance, and a capacitor. The assembly is connected to the terminals of the contacts of the second layer either via the first amplifier 38 or directly, if no first amplifier is present.

The damping system is then suited to effectively damp the resonances of the detector 10 at the frequencies at which they occur.

In yet another embodiment, the signal representing the excitation used for synchronous detection in FIG. 1 originates from a means of obtaining a signal representative of the excitation $H_{exc}$ of the current measurement other than the resistor 32 that is connected in series with the turns. In particular, it is possible to place a sensor suited for the necessary location or to directly use the signal provided by the excitation source 30.

In all aforementioned embodiments, and even when these embodiments are combined (to the extent technically possible), the current detector 10 is simpler and capable of measuring an electrical current with satisfactory precision that remains stable over time.

Such a detection approach can also be used in the case of a magnetic field sensor, which would then only include the probe 14 and the detection circuit 16, given that the magnetic field is proportional to the converted voltage detected.

The invention claimed is:

1. A current detector configured to measure a current circulating in an electrical conductor, the current detector including:
   a probe including:
      a converter configured to convert the magnetic field induced by the current to be measured in the conductor into a voltage, wherein the converter is a magnetostrictive, piezoelectric composite material,
      a detection circuit for detecting the voltage converted by the converter, and
      an excitation winding arranged to generate a magnetic modulation field in the converter, wherein the detection circuit includes a unit for demodulating the voltage converted by the converter,
   wherein the converter has an electric voltage-magnetic field feature including a linear portion and wherein the converter is configured to convert the magnetic field induced by the current to be measured in the linear portion of the electric voltage-magnetic field feature.

2. The current detector according to claim 1, wherein the detection circuit further includes a low-pass filter positioned after the unit for demodulating.

3. The current detector according to claim 1, wherein the current detector includes a magnetic flux concentrator having an air gap, wherein the probe is positioned in the air gap of the magnetic flux concentrator.

4. The current detector according to claim 3, wherein the magnetic flux concentrator includes two parts.

5. The current detector according to claim 1, wherein the current detector includes a support having two ends, a first end for holding the probe and a second end affixed to the conductor.

6. The current detector according to claim 1, wherein the detector includes the conductor in which the current to be measured circulates, wherein the conductor delimits a loop for which a centre is defined, wherein the probe is positioned in the centre of the loop.

7. A system comprising a current detector according to claim 1.

8. The system of claim 7, wherein the system is a motor.

9. A magnetic field sensor suited to measure a magnetic field, wherein the field sensor includes:
   a probe including:
      a converter configured to convert the magnetic field induced by a conductor into a voltage, wherein the converter is a magnetostrictive, piezoelectric composite material,
      a circuit for detecting the voltage converted by the converter, and
      an excitation winding arranged to generate a magnetic modulation field in the converter, wherein the circuit includes a unit for demodulating the voltage converted by the converter,
   wherein the converter has an electric voltage-magnetic field feature including a linear portion and wherein the converter is configured to convert the magnetic field induced by the current to be measured in the linear portion of the electric voltage-magnetic field feature.

10. A method for measuring a current circulating in an electrical conductor by a current detector including a converter, a detection circuit, and an excitation winding arranged to generate a magnetic modulation field in the converter, wherein the converter is a magnetostrictive, piezoelectric composite material, wherein the detection circuit includes a unit for demodulating the voltage converted by the converter, wherein the converter has an electric voltage-magnetic field feature including a linear portion, and wherein the method includes:
   converting, by the converter, the magnetic field induced by the current to be measured in the conductor into a voltage, wherein the conversion is carried out in the linear portion of the electric voltage-magnetic field feature, and
   detecting, by the detection circuit, the voltage converted by the converter.

* * * * *